United States Patent
Henderson et al.

(10) Patent No.: US 6,628,165 B1
(45) Date of Patent: Sep. 30, 2003

(54) POWER CONTROLLERS FOR AMPLITUDE MODULATION

(75) Inventors: Edward L. Henderson, Atkinson, NH (US); Samuel H. Nork, Andover, MA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/708,791

(22) Filed: Nov. 7, 2000

(51) Int. Cl.[7] ............................................. H03F 1/36
(52) U.S. Cl. .............................. 330/85; 330/2; 330/140
(58) Field of Search .............................. 330/2, 85, 129, 330/140, 141, 51; 455/126

(56) References Cited

U.S. PATENT DOCUMENTS

| | | | |
|---|---|---|---|
| 5,128,629 A | * | 7/1992 | Trinh .......................... 330/129 |
| 5,606,285 A | * | 2/1997 | Wang et al. ................. 330/134 |
| 6,167,242 A | * | 12/2000 | Henderson et al. ......... 455/126 |

* cited by examiner

*Primary Examiner*—Henry Choe
(74) *Attorney, Agent, or Firm*—Fish & Neave; Robert W. Morris; Jeffrey C. Aldridge

(57) ABSTRACT

The present invention provides radio frequency (RF) power controllers that regulate the power output signal of an RF power amplifier using a control signal. The RF power controller includes a power control amplifier that measures the difference between a feedback signal and a power control input signal to supply the control signal to the RF power amplifier. The output power signal is amplitude modulated for a period of time during an enable mode. During the amplitude modulation period, the RF power controller opens the power control loop and maintains a substantially constant output voltage to the RF power amplifier using a second amplifier and a capacitor coupled to power control amplifier. The capacitor is decoupled from the power control amplifier during the amplitude modulation period, and the second amplifier supplies the output voltage of the RF power controller based upon the stored voltage on the capacitor.

57 Claims, 5 Drawing Sheets

POWER CONTROLLERS FOR AMPLITUDE MODULATION

BACKGROUND OF THE INVENTION

This invention relates to power controllers. More specifically, this invention relates to power controllers for amplitude modulation in the radio frequency.

An RF power amplifier amplifies an RF input signal and drives a load, such as an antenna. The RF power amplifier determines the strength of an RF signal delivered to the load. For an antenna, the RF power amplifier determines the strength of an RF signal radiated by the antenna. In many applications such as cellular telephones and wireless data modems, the amount of RF energy delivered to the load must be tightly controlled within a specified range of power levels. Therefore, an RF power controller is often used to regulate the output of an RF power amplifier. The RF power controller determines the degree of amplification applied to the RF signal and thus the power level of a signal transmitted to the load.

An RF power controller may comprise an open loop or closed loop design. In an open loop system, the RF power controller compares a power control input signal, which indicates the desired output power level, with a fixed reference signal. The difference between the signals controls the amplification factor of the RF power amplifier.

In a closed loop system, the actual output of the RF power amplifier is compared with the power control input signal. The RF power controller adjusts the amplification factor of the RF power amplifier to minimize the difference between the measured power level and the desired power level. Closed loop control systems provide more accurate regulation of the output power level than open loop systems.

RF power amplifiers used for mobile communication output a power signal with a constant amplitude to a load based upon a phase modulated RF input signal. A new standard, referred to as EDGE, that is used by GSM phones increases data output rates by using amplitude modulation as well as phase modulation. An RF power controller cannot use a closed power control loop to control the output power of the RF power amplifier with the EDGE standard during amplitude modulation (AM). In EDGE systems, the output power signal of the RF power amplifier has a non-constant amplitude. A closed power control loop tends to cancel out the amplitude modulation in the power output signal in response to variations in the amplitude of the feedback signal, which is undesirable.

It would, however, be desirable to provide an RF power controller that accurately controls an amplitude modulated output power signal of an RF power amplifier using the EDGE standard or other standards such as the TDMA standard.

SUMMARY OF THE INVENTION

It is therefore an object of the present invention to provide an RF power controller that accurately controls an amplitude modulated output power signal of an RF power amplifier using the EDGE standard or other standards such as the TDMA standard that have non-constant amplitude power modulation.

It is also an object of the present invention to provide an RF power controller that regulates in open loop when the power output signal of the RF power amplifier is amplitude modulated.

It is also an object of the present invention to provide a system for maintaining a constant RF power controller output voltage during open loop.

It is also an object of the present invention to minimize voltage transients in the output voltage of the RF power controller when going from open loop to closed loop.

In accordance with this and other objects of the present invention, RF power controllers that provide an accurate power output signal from an RF power amplifier with amplitude modulation is provided. The present invention also includes methods for accurately controlling the RF power output signal of an RF power amplifier with amplitude modulation. RF power controllers of the present invention control an amplitude modulated power output signal from an RF power amplifier using the EDGE standard or other standards such as the TDMA standard that have non-constant amplitude power modulation. RF power controllers of the present invention close the power control loop during the-ramping up and subsequent ramping down of the RF power output signal in an enable cycle.

The RF power output signal is amplitude modulated during a period of time in between the time it is ramping up and ramping down. During the period of time that the RF power output signal is amplitude modulated, the power control loop is open, and the output voltage of the power control amplifier is stored on a capacitor followed by an amplifier. The amplifier output supplies the output voltage of the RF power controller to the RF power amplifier during the amplitude modulation period of time. The average value of the RF output power signal remains constant, because the power control output voltage supplied by the amplifier is constant.

The present invention may also include additional circuitry for further ensuring that the output voltage of the RF power controller remains substantially constant during the open loop period of time. The differential voltage at each input of the amplifier may be maintained on two capacitors during open loop. The present invention minimizes voltage transients in the output voltage of RF power controller as it transitions from open loop to closed loop by controlling the output voltage of the power control amplifier during open loop.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE PREFERRED EMBODIMENT

Figure 1:
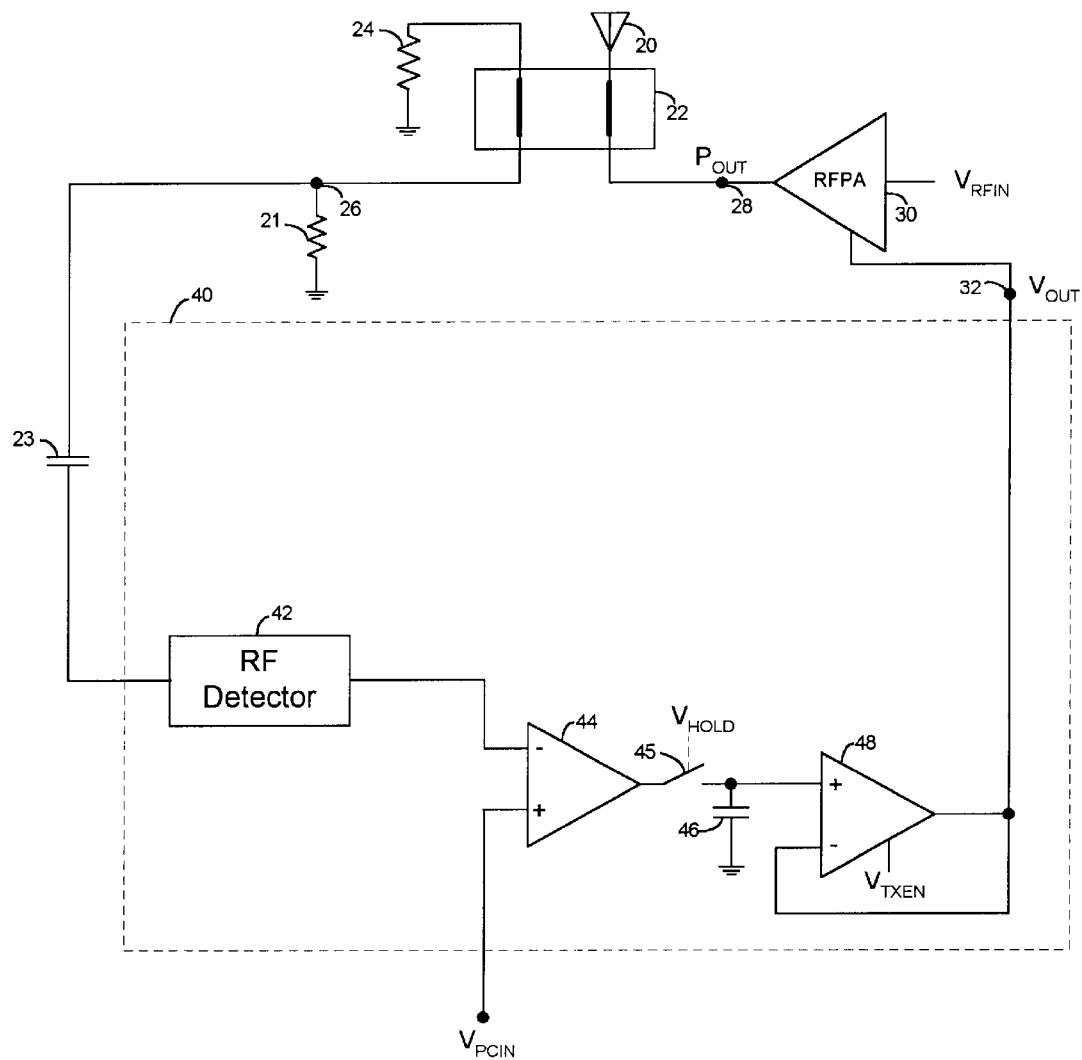
FIG. 1 is a schematic diagram of an RF power controller that controls the RF output power signal of an RF power amplifier in accordance with the principles of the present invention.

FIG. 1 is a schematic diagram of an embodiment of the present invention. RF power controller 40 shown in FIG. 1 provides output voltage $V_{OUT}$ at node 32 to regulate the power output signal $P_{OUT}$ of RF power amplifier 30 at node 28. Power control input signal $V_{PCIN}$, coupled to power control amplifier 44 of controller 40, indicates the power level required by the load.

RF power controllers of the present invention regulate the RF output power signal $P_{OUT}$ of an RF power amplifier using an output voltage signal $V_{OUT}$. Power is drawn by the load from the RF power amplifier during an "enable" mode. An analog power control input signal $V_{PCIN}$ indicates to the RF power controller what power level the RF power amplifier should send to the load during enable mode. The RF power controller provides an output voltage signal $V_{OUT}$ to the RF power amplifier in response to $V_{PCIN}$. The output voltage signal $V_{OUT}$ regulates the power level $P_{OUT}$ that the RF power amplifier needs to output to the load. The RF power amplifier has a transfer curve that determines the relationship between the output voltage $V_{OUT}$ of the RF power controller and the power output $P_{OUT}$ Of the RF power amplifier. The output voltage $V_{OUT}$ is an accurate indication of the power level $P_{OUT}$ to be outputted by the RF power amplifier during each enable period.

The output power requirement of the RF power amplifier may vary as the distance to the base station changes. The base station may send a signal back to the application device (e.g., cellular phone) indicating that more or less power is required by the RF power amplifier in the next enable mode for the antenna to supply the desired signal intensity to the base station. The application device responds to the signal from the base station by increasing or decreasing the power control input signal in the next enable mode, so that $P_{OUT}$ of the RF power amplifier is increased or decreased appropriately.

The power control input signal $V_{PCIN}$ also indicates when the RF power amplifier no longer requires output power. The RF power controller responds by reducing its output voltage to zero which directs the RF power amplifier to discontinue its power output. The RF power amplifier is essentially dormant during standby mode which follows each enable mode. The duty cycle of the RF power amplifier includes the time the RF power amplifier is in ENABLE mode and in STANDBY mode.

When the RF power controller closes the power control loop during enable mode, the output power signal $P_{OUT}$ is regulated to the level indicated by $V_{PCIN}$ using a feedback signal (e.g., at node 26 in FIG. 1) from the RF power amplifier. The feedback signal is indicative of $P_{OUT}$ at a given point in time. The RF power controller uses the feedback signal to determine whether the RF power amplifier is outputting the power level called for by $V_{PCIN}$.

A portion of the power output signal $P_{OUT}$ of the RF power amplifier is provided as the feedback signal to the RF power controller. The RF power controller uses the feedback signal to regulate the power output signal $P_{OUT}$ of the RF power amplifier when the power control loop is closed. The feedback signal from the RF power amplifier is compared to the power control input signal $V_{PCIN}$ by a power control amplifier which varies the output voltage signal $V_{OUT}$ of the RF power controller accordingly to regulate $P_{OUT}$.

The feedback signal can be a voltage feedback signal or a current feedback signal. The power control input signal $V_{PCIN}$ indicates how much power the RF power amplifier should be providing to the load. If $P_{OUT}$ is less than indicated by the power control input signal $V_{PCIN}$, the feedback signal causes the RF power controller to increase $V_{OUT}$, causing $P_{OUT}$ to increase. Conversely, if $P_{OUT}$ is greater than indicated by the power control input signal $V_{PCIN}$, the feedback signal causes the RF power controller to decrease $V_{OUT}$, causing $P_{OUT}$ to decrease. Thus, the RF power controller adjusts $V_{OUT}$ based on the feedback signal in order to regulate the output power signal $P_{OUT}$ of the RF power amplifier to the level indicated by $V_{PCIN}$.

When the power control loop is closed, the RF power controller can use the feedback signal to cancel out effects that would otherwise cause unwanted changes in the relationship between $P_{OUT}$ of the RF power amplifier and $V_{OUT}$ of the RF power controller. For example, voltage changes in the carrier signal of the RF input signal to the RF power amplifier, heat changes in the RF power amplifier itself, and changes in the impedance of the load can all cause the RF power amplifier to output too much or too little power when the power control loop is open. In addition, variations in the tolerance of a particular RF power amplifier can also adversely effect its output power signal when the loop is open. Variations in tolerance of an RF power amplifier may be caused by variations in the threshold voltages of transistors within the RF power amplifier. The output voltage $V_{OUT}$ of the RF power controller is not varied during open loop to cancel out these offset effects. When the power control loop is closed, the RF power controller uses the feedback signal to cancel out these offset effects by varying $V_{OUT}$ until the RF power amplifier outputs the correct amount of power.

RF power controllers of the present invention provide a closed power control loop for a period of time during each enable mode to remove these adverse effects that distort the power output signal $P_{OUT}$ of the RF power amplifier. RF power controllers of the present invention also provide an open power control loop for a period of time during each enable mode when $P_{OUT}$ is amplitude modulated as well as phase modulated. During the amplitude modulation period (i.e., AM mode), the power control loop is open so that the feedback signal does not cancel the amplitude modulation of $P_{OUT}$.

Referring to FIG. 1, RF power controller 40 includes RF detector 42, power control amplifier 44, capacitor 46, switch 45, and buffer amplifier 48. RF power amplifier 30 provides output power $P_{OUT}$ to a load (illustrated as antenna 20). The output power signal $P_{OUT}$ of RF power amplifier 30 at node 28 is provided to antenna 20 via directional coupler 22. Directional coupler 22 may be, for example, a transformer circuit.

A buffer amplifier and a capacitor are provided at the output of the RF power controller to maintain a constant $V_{OUT}$ during the open loop period. During open loop, the output of the power control amplifier is decoupled from the capacitor, and the voltage at the capacitor remains substantially constant. The buffer amplifier has an input coupled to the capacitor and an output coupled to the output of the RF power controller. RF power controllers of the present invention may be used with EDGE standard systems or other standards such as the TDMA standard that have non-constant amplitude power modulation.

Buffer amplifier 48 has an enable input that is coupled to enable signal $V_{TXEN}$ as shown in FIG. 1. $V_{TXEN}$ is LOW during standby mode and is HIGH during enable mode. When $V_{TXEN}$ is LOW, buffer amplifier 48 is OFF. When $V_{TXEN}$ is HIGH during enable mode, buffer amplifier 48 is ON and enabled. The opening and closing of switch 45 is controlled by HOLD signal $V_{HOLD}$. When $V_{HOLD}$ is HIGH, switch 45 is open and not conducting current. When $V_{HOLD}$ is LOW, switch 45 is closed and conducts current. $V_{HOLD}$ is a signal that may come from a source that is external to the RF power controller. For example, $V_{HOLD}$ may be supplied by a user as an external signal, or may be supplied by other circuitry external to the RF power controller.

Figure 2:
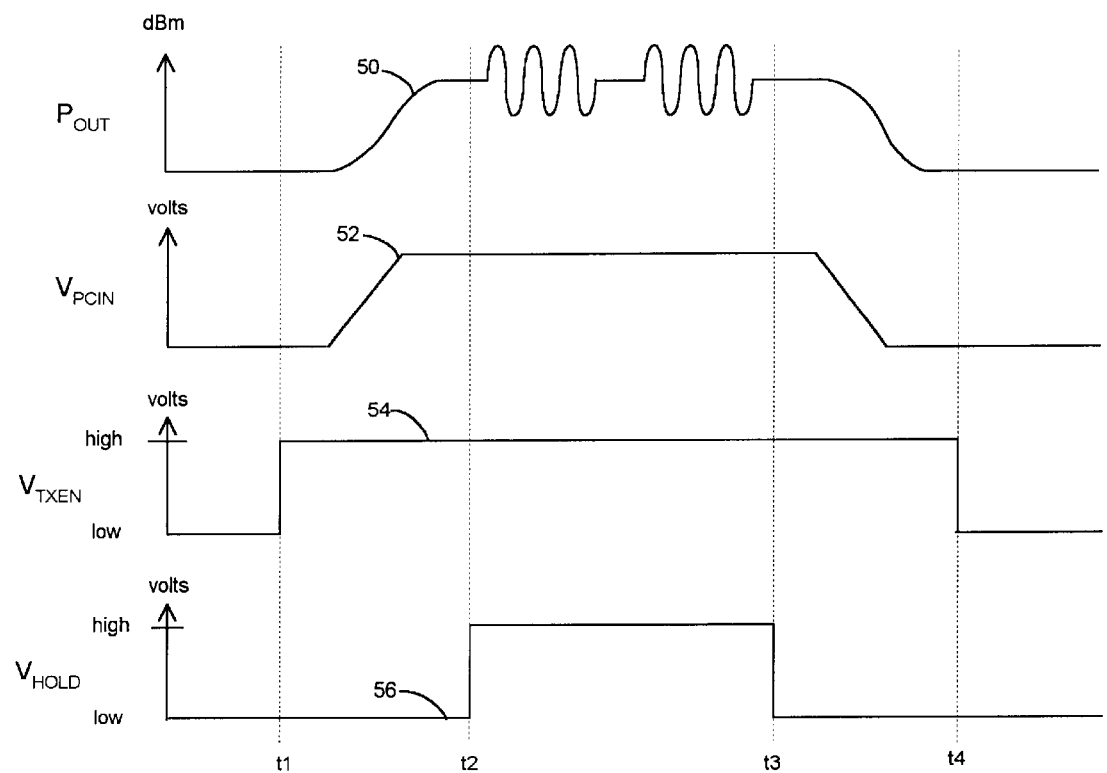
FIG. 2 is a graphical depiction of waveforms of the circuits of FIGS. 1, 3, 4, and 5.

FIG. 2 is a graph of illustrative signals for the circuit of FIG. 1. FIG. 2 shows examples of power output signal $P_{OUT}$ as curve 50, power control input signal $V_{PCIN}$ as curve 52, enable signal $V_{TXEN}$ as curve 54, and HOLD signal $V_{HOLD}$ as curve 56. Power control input signal $V_{PCIN}$ is provided as an input to RF power controller 40. $V_{PCIN}$ is typically provided to RF power controller 40 from an external source (not shown). Typical applications of RF power amplifier 30 often provide the power requirements as a digital signal. The digital signal must be converted to an analog signal prior to being input to RF power controller 40. This conversion is typically performed by a DAC (digital-to-analog converter). The analog signal is applied to an input of RF power controller 40 as $V_{PCIN}$.

When $V_{PCIN}$ is zero, $V_{OUT}$ is zero, and RF power amplifier 30 outputs no power ($P_{OUT}$=0) as shown in FIG. 2. $V_{TXEN}$ goes from a logic LOW (e.g., 0 volts) to a logic HIGH (e.g., 5 volts) indicating the commencement of enable mode during which RF power amplifier 30 provides output power to the load. Enable mode is the period of time that $V_{TXEN}$ is HIGH, e.g., from t1 to t4, as shown in FIG. 2. At time t1, $V_{PCIN}$ begins to ramp up causing RF power controller 40 to increase output signal $V_{OUT}$. In response to the increase in output signal $V_{OUT}$ from RF power controller 40, RF power amplifier 30 increases signal $P_{OUT}$ providing power to antenna 20. RF power amplifier 30 has a transfer curve that determines the relationship between $V_{OUT}$ and $P_{OUT}$. After time t1, $V_{PCIN}$ stops ramping up and levels off at a fixed value. This value is indicative of the required output power during the current enable mode. Between times t1 and t2, $V_{HOLD}$ is LOW and switch 45 is closed so that the power control loop is closed and RF power controller 40 regulates $P_{OUT}$ using a feedback signal.

The output signal $P_{OUT}$ of RF power amplifier 30 at node 28 oscillates at the same radio frequency as the RF signal at its input $V_{RFIN}$ (e.g., 1.8 GHz). Directional coupler 22 feeds back a portion of the signal at node 28 to node 26. The signal at node 26 is proportional to the signal at node 28 and oscillates at the same frequency as the signal at node 28. A termination resistor 21 is coupled between node 26 and ground.

The feedback signal at node 26 is a voltage feedback signal. The voltage feedback signal is received at the input of RF detector 42 which is coupled to capacitor 23. RF detector 42 outputs a low frequency signal at the inverting input of power control amplifier 44 that is proportional to the voltage feedback signal at its input. Power control amplifier 44 is coupled to receive $V_{PCIN}$ at its non-inverting input. The power control amplifier 44 provides an output signal indicative of the difference between the output of RF detector 42 and power control input signal $V_{PCIN}$.

The output signal of power control amplifier 44 is provided to capacitor 46 and the non-inverting input of buffer amplifier 48 through switch 45. The output of buffer amplifier 48 is coupled to output node 32 of RF power controller 40 and the inverting input of buffer amplifier 48. Buffer amplifier 48 buffers the voltage on capacitor 46 to provide output signal $V_{OUT}$.

Between times t1 and t2 switch 45 is closed because $V_{HOLD}$ is LOW, and power control amplifier 44 charges capacitor 46 and drives buffer amplifier 48. During this time interval, $V_{OUT}$ is determined by the values of $V_{PCIN}$ and the feedback signal at node 26. Thus, between times t1 and t2, RF power amplifier 30 provides power to antenna 20, and RF power controller 40 sets the voltage of signal $V_{OUT}$ to regulate output signal $P_{OUT}$ of power amplifier 30.

After $V_{PCIN}$ has reached a constant value as shown in FIG. 2, HOLD signal $V_{HOLD}$ goes HIGH at time t2. When $V_{HOLD}$ goes HIGH, switch 45 opens and the non-inverting input of buffer amplifier 48 is decoupled from the output of power control amplifier 44. $V_{HOLD}$ remains HIGH and switch 45 remains open at least as long as the duration of the amplitude modulation period of $P_{OUT}$. Signal $V_{HOLD}$ is generated by external circuitry which causes it to be HIGH during AM mode and LOW otherwise.

During the period of time that switch 45 remains open, there is some charge leakage from capacitor 46. However, the voltage on capacitor 46 remains substantially constant, and thus $V_{OUT}$ remains approximately constant between times t2 and t3 when switch 45 is open. Buffer amplifier 48 buffers the voltage on capacitor 46. Buffer amplifier 48 may have any appropriate gain value. For example, buffer amplifier 48 may be a unity gain amplifier or have a gain of 2.

When switch 45 is open between times t2 and t3, $V_{OUT}$ is not dependent upon the feedback signal at node 26. Therefore, the amplitude modulated signal at $P_{OUT}$ between times t2 and t3 is not adversely affected by changes in $V_{OUT}$ caused by the voltage feedback signal during the amplitude modulation period. During the open loop period, effects that can change the relationship between $V_{OUT}$ and $P_{OUT}$ mentioned above are insignificant within the time span of a typical enable mode. For example, a typical duration of enable mode (t1 to t4) is about 0.6 ms. $P_{OUT}$ is likely to change only about a few tenths of a decibel during a 0.6 ms period of time. Changes in the impedance of the load occur over a much greater period of time than 0.6 ms. Also, $V_{RFIN}$ is not likely to change significantly in 0.6 ms, because of the slow discharge of the battery.

Thus, the closed loop period of time at the beginning of each enable cycle cancels out offsets due to heat changes in RF power amplifier 30, changes in the voltage of signal $V_{RFIN}$, changes in the impedance of antenna 20, and variations of the thresholds of transistors within amplifier 30. None of these effects are likely to cause a significant change in the relationship between $V_{OUT}$ and $P_{OUT}$ during the open loop period of the enable mode, because changes in these effects typically occur over a much longer period of time relative to the duration of enable mode.

Between times t2 and t3, there may be a period of time (e.g., about 4 µs) during which $P_{OUT}$ is not amplitude modulated as shown, for example, in FIG. 2. During this period of time, $V_{HOLD}$ may be LOW to close switch 45 so that RF power controller 40 is again operating in closed loop as described above. It may be advantageous to close the power control loop during this time to further ensure that any residual adverse effects on $P_{OUT}$ are canceled out.

At time t3, signal $P_{OUT}$ is no longer amplitude modulated such that RF power controller 40 can operate in closed loop without canceling out amplitude modulation in $P_{OUT}$. At time t3, $V_{HOLD}$ goes LOW again as shown in FIG. 2, and switch 45 closes. The power control loop is now closed so that variations in $V_{PCIN}$ again cause variations in $V_{OUT}$. The output voltage of amplifier 44 may change during the amplitude modulation period due to changes in the voltage feedback signal. Therefore, a voltage transient may occur on $V_{OUT}$ at time t3 when switch 45 closes again. This voltage transient is undesirable, and additional circuitry may be added to remove it as discussed below with respect to FIG. 3.

After time t3, power control input signal $V_{PCIN}$ ramps down to zero. RF power controller 40 varies $V_{OUT}$ So that $P_{OUT}$ also ramps down to zero as shown in FIG. 2. Power control amplifier 44 amplifies the difference between $V_{PCIN}$ and the output of RF detector 42 using the closed loop arrangement discussed above to ensure that $P_{OUT}$ reaches zero. A brief period of time after $V_{PCIN}$ reaches zero, $V_{TXEN}$ goes LOW again ending the previous enable mode and beginning the next standby mode.

Figure 3:
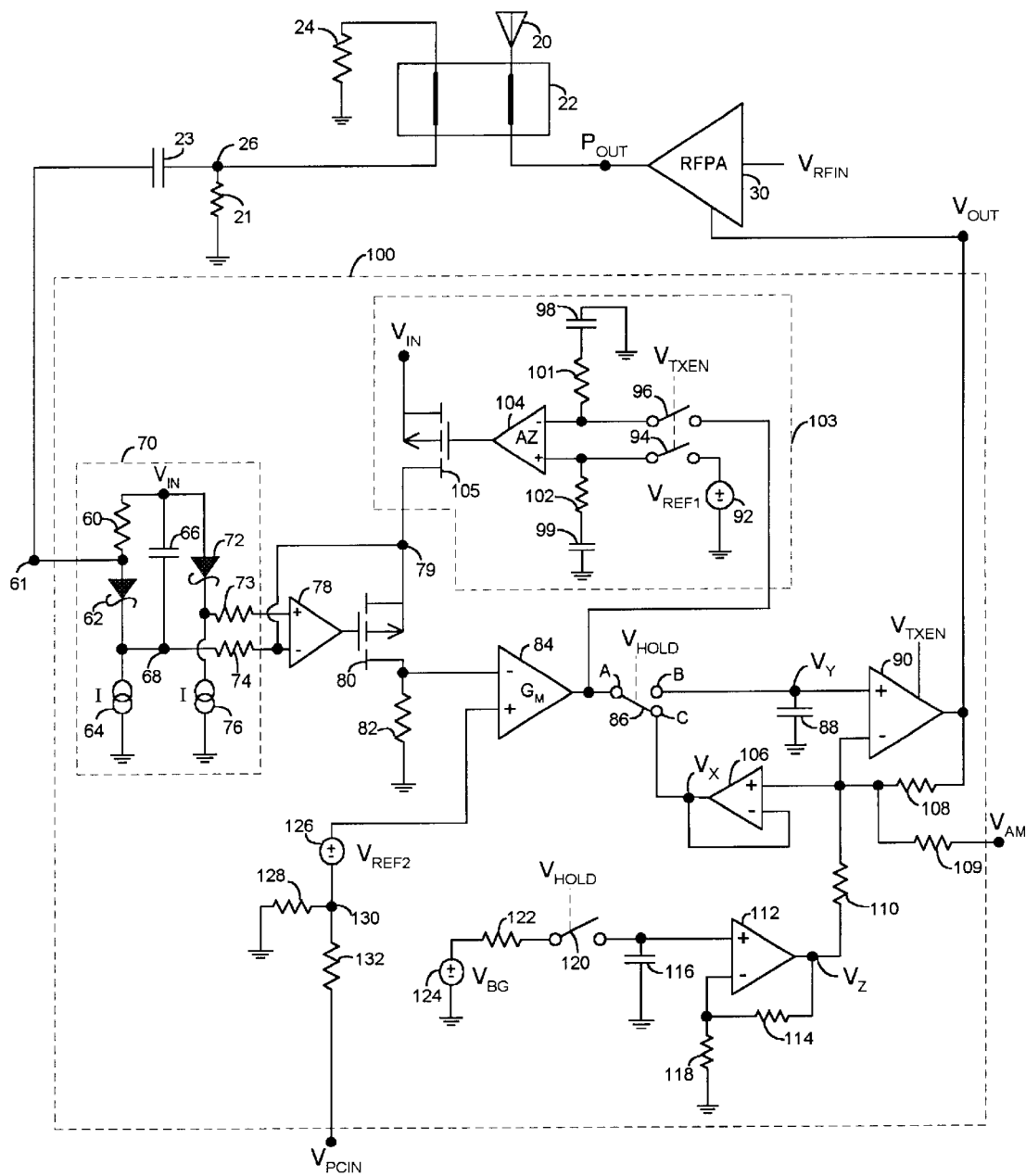
FIG. 3 is a schematic diagram of an RF power controller with an RF detector that receives a voltage feedback signal in accordance with the principles of the present invention.

A further embodiment of RF power controllers of the present invention is shown in FIG. 3. RF power controller 100 controls the power output $P_{OUT}$ of RF power amplifier 30 to antenna 20. Voltage is fed from directional coupler 22 using capacitor 23 and resistors 21 and 24 into node 61 as a voltage feedback signal. RF power controller 100 includes RF peak detector 70, auto zero loop circuitry 103, FET (field effect transistor) 80, power control (transconductance) amplifier 84, buffer amplifier 106, amplifier 78, amplifier 112, amplifier 90, capacitors 88 and 116, switches 86 and 120, reference voltage sources 124 and 126, and resistors 82, 108, 109, 110, 114, 118, 122, 128, and 132. RF peak detector 70 includes schottky diodes 62 and 72, capacitor 66, current sources 64 and 76, and resistors 60, 73, and 74. Auto zero loop circuitry 103 includes auto zero amplifier 104, switches 94 and 96, reference voltage 92, resistors 101 and 102, capacitors 98 and 99, and FET 105.

During each standby mode, auto zero loop circuitry 103 cancels out offset voltages associated with $V_{PCIN}$, power control amplifier 84, and variations in the voltage drop of diodes 62 and 72. $V_{TXEN}$ is LOW during standby mode and is HIGH during enable mode. When $V_{TXEN}$ is LOW, switches 94 and 96 are closed, and $V_{TXEN}$ also controls the output $V_{OUT}$ of amplifier 90, preventing RF power amplifier 30 from turning ON when $V_{TXEN}$ is LOW. The auto zero loop is closed, because the output of amplifier 84 is coupled to the inverting input of auto zero amplifier 104 through switch 96.

During standby mode, auto zero amplifier 104 measures offset voltages associated with amplifier 84 and effectively cancels those offset voltages by setting the current through FETs 105 and 80 to modify the voltage at the inverting input of amplifier 84. Auto zero amplifier 104 measures the differential voltage at its inputs and causes the output voltage of amplifier 84 to equal $V_{REF1}$. Voltage $V_{REF1}$ (amplified by the gain of amplifier 90) appears as a step at $V_{OUT}$ at the start of each enable mode. This step voltage acts as a starting voltage that decreases the amount of time required to turn ON RF power amplifier 30, but is well below the turn ON threshold of RF power amplifier 30. Therefore, auto zero amplifier 104 cancels offsets in the output voltage of amplifier 84 that can cause RF power amplifier 30 to turn ON too soon or too late, relative to $V_{PCIN}$.

Switches 94 and 96 are open during each enable mode when $V_{TXEN}$ is HIGH, and the common mode voltage at the inputs of amplifier 104 is stored on capacitors 98 and 99 so that the offset voltages continue to be canceled. Further features of an RF power controller with offset voltage cancellation is described in Henderson et al. U.S. Pat. No. 6,167,242, which is hereby incorporated by reference in its entirety.

Amplifier 90 has an enable input that is coupled to enable signal $V_{TXEN}$ as shown in FIG. 3. When $V_{TXEN}$ is LOW in standby mode, amplifier 90 is OFF, and switches 94 and 96 are closed. When $V_{TXEN}$ is HIGH during enable mode, amplifier 90 is ON and enabled, and switches 94 and 96 are open. The opening and closing of switches 86 and 120 are controlled by HOLD signal $V_{HOLD}$. When $V_{HOLD}$ is LOW, switch 120 is closed and conducts current, and switch 86 couples its A and B terminals together. When $V_{HOLD}$ is HIGH, switch 120 is open and not conducting current, and switch 86 couples its A and C terminals together.

The example waveforms shown in FIG. 2 also apply to the embodiment of FIG. 3. When $V_{TXEN}$ is LOW, amplifier 90 is disabled, and therefore $V_{OUT}$ and $P_{OUT}$ are zero. $V_{TXEN}$ goes from a logic LOW (e.g., 0 volts) to a logic HIGH (e.g., 5 volts) at time t1 indicating the commencement of enable mode during which RF power amplifier 30 provides output power to the load. Amplifier 90 is now enabled. Switch 120 is closed, and switch 86 has its A and B terminals coupled together, because $V_{HOLD}$ is LOW. The power control loop is closed and RF power controller begins to regulate $P_{OUT}$.

Enable mode is the period of time that $V_{TXEN}$ is HIGH, e.g., from t1 to t4, as shown in FIG. 2. When $V_{PCIN}$ is zero, RF power amplifier 30 outputs no power, and $P_{OUT}$ is zero as shown in FIG. 2. At time t1, $V_{PCIN}$ begins to ramp up causing RF power controller 100 to increase output signal $V_{OUT}$. When $V_{OUT}$ from RF power controller 100 reaches the threshold voltage of RF power amplifier 30, RF power amplifier 30 starts to produce output power $P_{OUT}$ to antenna 20. RF power amplifier 30 has a transfer curve that determines the relationship between $V_{OUT}$ and $P_{OUT}$. The output power signal $P_{OUT}$ ramps up as $V_{PCIN}$ ramps up as shown in curve 50.

When $V_{PCIN}$ ramps up, current flows from $V_{PCIN}$ across the resistor divider formed by resistors 128 and 132 to ground. The voltage at node 130 is set by the ratio of the resistor divider. The voltage that appears at the non-inverting input of power control amplifier 84 is the voltage at node 130 plus the voltage of reference voltage source 126. Amplifier 84 causes the voltage at its output to ramp up in response to $V_{PCIN}$ increasing. Amplifier 90 ramps up its output voltage $V_{OUT}$ in response to the output voltage of amplifier 84. RF power amplifier 30 then causes $P_{OUT}$ to increase in response to $V_{OUT}$. The finite slope of $V_{PCIN}$ as it ramps up provides a slow start-up for RF power amplifier 30 that reduces transient responses generated by RF power amplifier 30.

The output power signal $P_{OUT}$ of RF power amplifier 30 is sent to antenna 20 via directional coupler 22. Directional coupler 22 may be, for example, a transformer circuit. $P_{OUT}$ oscillates at the same radio frequency as the RF signal at its input $V_{RFIN}$ (e.g., 1.8 GHz). The voltage at node 61 is a voltage feedback signal that varies proportionally with $P_{OUT}$ and oscillates at the same frequency as $P_{OUT}$. Capacitor 23 level shifts the signal at node 26 referenced to ground to a signal at node 61 referenced to $V_{IN}$. Node 61 is located at the input of RF peak detector 70 of RF power controller 100.

RF peak detector 70 includes input voltage source $V_{IN}$, resistor 73, resistor 74, resistor 60, schottky diodes 62 and 72, capacitor 66, and current sources 64 and 76. $V_{IN}$ is a supply voltage. Current flows from $V_{IN}$ through schottky diodes 62 and 72 and current sources 64 and 76 to ground, respectively. The current through current sources 64 and 76 are roughly equal to each other. Current source 76 provides a reference voltage at the non-inverting input of amplifier 78 that is set by the voltage drop of diode 72. The feedback voltage at node 61 is converted into a low frequency signal by RF peak detector 70. The signal at node 61 is rectified by schottky diode 62 and smoothed by capacitor 66 to form a low frequency signal at the inverting input of amplifier 78. If desired, diodes 62 and 72 may be replaced by transistors such as FETs that can be used as source followers to rectify the RF signal.

The voltage at the inverting input of amplifier 78 (node 79) increases as the voltage at node 61 increases. As a result, the output voltage of amplifier 78 falls causing p-channel MOSFET 80 to send more current through resistor 82. This additional current is provided via resistor 74 and regulates the voltage at node 79 creating a virtual ground. Thus, as the voltage feedback signal at node 61 rises, the currents through diode 62, resistor 74, MOSFET 80, and resistor 82 increase. Conversely, as the voltage feedback signal at node 61 drops, the currents through diode 62, resistor 74, MOSFET 80, and resistor 82 decrease.

Amplifier 78 and transistor 80 level shift the voltage feedback signal from $V_{IN}$ to ground so that it can be provided to the inverting input of power control amplifier 84. The voltage at the inverting input of power control amplifier 84 increases as the voltage drop across resistor 82 increases. The increase in voltage at the inverting input of amplifier 84 causes its output voltage to increase more slowly as $V_{PCIN}$ rises. The output of amplifier 84 determines the voltage of $V_{OUT}$ through amplifier 90 when $V_{HOLD}$ is LOW. Amplifier 90 has a fixed closed loop gain (e.g., 2). Amplifier 90 amplifies the output of amplifier 84 to provide signal $V_{OUT}$ at its output.

The output of amplifier 84 is coupled to the non-inverting input of amplifier 90 when $V_{HOLD}$ is LOW and switch 86 couples its A and B terminals together. The inverting input of amplifier 90 is coupled to its output through resistor 108 and to the output of amplifier 112 through resistor 110. In the present application, two circuit elements are "coupled" when a current path exists between them, even if the two circuit elements are not directly connected together, such as amplifiers 90 and 112. The inverting input of amplifier 112 is coupled to its output through resistor 114 and to ground through resistor 118. The non-inverting input of amplifier 112 is coupled to capacitor 116 and to band gap voltage source 124 through switch 120 and resistor 122. Voltage source 124 has a voltage of $V_{BG}$, which could be any number of voltage values.

Amplifier 112 provides a reference voltage $V_Z$ at its output based on $V_{BG}$, the resistance $R_{114}$ of resistor 114, and the resistance $R_{118}$ of resistor 118, while $V_{HOLD}$ is LOW and switch 120 is closed, according to the following equation:

$$V_Z = V_{BG}\left(1 + \frac{R_{114}}{R_{118}}\right) \quad (1)$$

Amplifier 112 may, e.g., have a closed loop gain of 1.18. Amplifier 90 amplifies the difference between $V_Z$ and $V_Y$ to provide $V_{OUT}$. The output voltage $V_{OUT}$ of amplifier 90 is determined by the output voltage of amplifier 112, the resistance ratio of resistors 108 and 110, and the voltage on capacitor 88 at the non-inverting input of amplifier 90. The current through resistor 110 equals the DC current through resistor 108, assuming that the inputs of amplifiers 106 and 90 have an infinite impedance. The DC voltages at both terminals of resistor 109 are the same, and therefore the DC gain of amplifier 90 may be computed by assuming that no DC current flows through resistor 109. $V_{OUT}$ may be derived by setting the equations for the current through resistors 110 and 108 equal to each other. The output voltage $V_{OUT}$ of amplifier 90 is shown by the following equation:

$$V_{OUT} = V_Y + (V_Y - V_Z)\frac{R_{108}}{R_{110}} \quad (2)$$

where $V_Y$ equals the voltage on capacitor 88 at the non-inverting input of amplifier 90, $V_Z$ is the voltage at the output of amplifier 112, $R_{108}$ is the resistance of resistor 108, and $R_{110}$ is the resistance of resistor 110. Equation (2) is derived by assuming that the DC voltage at the inverting input of amplifier 90 substantially equals the DC voltage at its non-inverting input. Thus, the output voltage $V_Z$ of amplifier 112 provides a reference voltage used by amplifier 90 to set $V_{OUT}$ based on the output voltage of amplifier 84 between times t1 and t2 (and between times t3 and t4). Amplifier 90 functions as a buffer for the output of amplifier 84. The combination of gains and reference voltages shown by equations (1) and (2) are set so that amplifier 84 remains in a voltage range that ensures a high impedance output at $V_Y$, and that $V_{OUT}$ swings over the entire control voltage range required by RF power amplifier 30.

The voltage feedback signal at node 61 allows RF power controller 100 to regulate output power signal $P_{OUT}$ of RF power amplifier 30 during enable mode. If $P_{OUT}$ is too high, the feedback signal at node 61 increases, causing power control amplifier 84 to decrease $V_{OUT}$. The decrease in $V_{OUT}$ causes RF power amplifier 30 to output less power, and $P_{OUT}$ decreases. If $P_{OUT}$ is too low, the feedback signal at node 61 decreases, causing power control amplifier 84 to increase $V_{OUT}$. The increase in $V_{OUT}$ causes RF power amplifier 30 to output more power, and $P_{OUT}$ increases. After time t1, $V_{PCIN}$ stops ramping up and levels off at a fixed value. This value is indicative of the required output power during the current enable mode. Power control amplifier 84 causes $V_{OUT}$ to stop increasing as the voltage at its non-inverting input stops increasing. The closed loop bandwidth of controller 100 is determined by the transconductance ($g_m$) of amplifier 84, the capacitance of capacitor 88, the gain of amplifier 90, the gain of RF detector 70, and the external loop gain associated with RF power amplifier 30 and directional coupler 22.

AM mode begins when $V_{PCIN}$ and $P_{OUT}$ have leveled off. AM mode occurs between times t2 and t3 in FIG. 2. During AM mode, $P_{OUT}$ contains amplitude modulated information as well as phase modulated information. $P_{OUT}$ may be amplitude modulated by providing amplitude modulated information in $V_{RFIN}$, in the power supply of RF power amplifier 30, or by providing amplitude modulated information in control signal $V_{OUT}$. Amplitude modulated signal $V_{AM}$ may be coupled to resistor 109 as shown in FIG. 3 to provide amplitude modulated information in $V_{OUT}$ during AM mode. $V_{AM}$ is an AC signal that does not effect the DC gain of amplifier 90.

The power control loop cannot be closed during AM mode, because the loop tends to cancel the amplitude modulated portion of $P_{OUT}$. Therefore, the power control loop is open during AM mode in controllers of the present invention, and the output voltage of amplifier 90 at time t2 is held to maintain the amplification factor of $P_{OUT}$ constant. When $V_{HOLD}$ goes HIGH at time t2 (FIG. 2), switch 120 opens, and switch 86 coupled its A and C terminals together. The output of amplifier 84 is decoupled from amplifier 90 during the time that $V_{HOLD}$ is HIGH to prevent the feedback circuitry and amplifier 84 from canceling the amplitude modulation in $P_{OUT}$ during the AM mode.

The output voltage of amplifier 84 at the moment $V_{HOLD}$ goes HIGH is stored on capacitor 88. $V_{BG}$ is stored on capacitor 116 when switch 120 opens at the moment $V_{HOLD}$ goes HIGH. The voltages on capacitors 88 and 116 decay during AM mode due to leakage currents associated with switches 86 and 120, respectively. Leakage on capacitors 88 and 116 causes the voltages at the inputs of amplifier 90 to decrease or increase. The voltages at the inverting and non-inverting inputs of amplifier 90 should change at a rate that ensures that output voltage $V_{OUT}$ of amplifier 90 remains substantially constant during AM mode.

Amplifier 112, switch 120, reference voltage 124, capacitor 116, and resistors 122, 114 and 118 have been added to controller 100 to ensure that the differential voltage at the inputs of amplifier 90 decays such that $V_{OUT}$ remains substantially constant during open loop AM mode between times t2 and t3. Thus, this additional circuitry reduces variations in $V_{OUT}$ during AM mode. Capacitor 116 and amplifier 112 ensure that the change in voltage at the inverting input of amplifier 90 cancels the change in voltage on capacitor 88 at the non-inverting input of amplifier 90. The capacitance of capacitors 116 and 88 should be chosen so that the voltage $V_{OUT}$ at the output of amplifier 90 remains substantially constant, according to the following equation:

$$\frac{C_{116}}{C_{88}} = \frac{\left(\frac{R_{108}}{R_{110}}\right)\left(\frac{R_{114}+R_{118}}{R_{118}}\right)}{\left(\frac{R_{108}+R_{110}}{R_{110}}\right)} \quad (3)$$

Equation (3) assumes that the leakage currents associated with switches 86 and 120 are equal. This matching of leakage currents can be achieved by making both switches from the same sized devices.

Power signal $P_{OUT}$ varies as shown, for example, in curve 50 of FIG. 2 between times t2 and t3 during AM mode. Consequently, the voltage feedback signal at node 61 also varies during AM mode causing the output of amplifier 84 to vary as discussed above. The output voltage of amplifier 84 does not affect $V_{OUT}$ of controller 100 during AM mode because switch 86 decouples amplifier 84 from amplifier 90 during this period of time. However, at time t3 in FIG. 2, AM mode ends and $V_{HOLD}$ goes LOW again causing switch 120 to close and switch 86 to couple its A and B terminals together. Thus, at time t3, the output of amplifier 84 again determines the value of $V_{OUT}$.

As long as $V_{PCIN}$ remains constant, $V_{OUT}$ should remain constant as well. The output voltage of amplifier 84 at time t3 needs to be the same as the output voltage of amplifier 84 at time t2 to maintain a substantially constant $V_{OUT}$. If at time t3 the voltage at the output of amplifier 84 has changed relative to its output voltage at time t2 due to changes in the voltage feedback signal caused by amplitude modulation in $P_{OUT}$, a voltage transient appears at $V_{OUT}$ at time t3 when amplifiers 84 and 90 are coupled together again. A voltage transient is a undesirable voltage change in $V_{OUT}$ caused by parasitic effects associated with the power control loop. This voltage transient in $V_{OUT}$ causes inaccuracies in the power output signal $P_{OUT}$ for a brief period of time. The voltage transient disappears shortly thereafter when the power control loop regulates $V_{OUT}$ to its proper value.

Unity gain buffer amplifier 106 has been added to maintain the output voltage of amplifier 84 constant during AM mode to minimize voltage transients in $V_{OUT}$ after time t3. Unity gain buffer amplifier 106 clamps the output voltage of amplifier 84 to the voltage $V_Y$ held on capacitor 88. This ensures that when AM mode ends at time t3, the output of amplifier 84 is at the correct voltage to maintain $P_{OUT}$ constant immediately after t3 as shown, for example, in FIG. 2. Variations in the input signal from RF detector 70 at the inverting input of amplifier 84 that are caused by amplitude modulation in $P_{OUT}$, are absorbed by buffer amplifier 106.

When switch 86 couples its A and C terminals together during AM mode ($V_{HOLD}$ HIGH), the output terminals of buffer amplifier 106 and amplifier 84 are coupled together. The non-inverting input of amplifier 106 is coupled to the inverting input of amplifier 90 and to resistors 108 and 110 as shown in FIG. 3. The inverting input of amplifier 106 is coupled directly to its output to provide a closed loop gain of 1. As previously stated, the differential voltage between the non-inverting and inverting inputs of amplifier 90 is insubstantial (in the order of millivolts) relative to the DC voltages at the two inputs. Therefore, voltage at the non-inverting input of amplifier 106 substantially equals $V_Y$. Buffer amplifier 106 maintains the output voltage of amplifier 84 constant by maintaining it at $V_Y$ during AM mode.

Variations in the output voltage of amplifier 84 during AM mode can also cause voltage changes in $V_Y$ and $V_{OUT}$ through parasitic capacitance associated with switch 86, even though amplifier 84 is decoupled from capacitor 88 during this time interval. Amplifier 106 maintains the output voltage of amplifier 84 constant, so as to eliminate undesirable voltage changes in $V_Y$ caused by variations in the output voltage of amplifier 84. Thus, amplifier 106 helps to maintain $V_{OUT}$ constant during AM mode.

When AM mode ends at time t3, $V_{HOLD}$ goes LOW again causing switch 120 to close and switch 86 to coupled its A and B terminals together as previously mentioned. When switch 120 closes at time t3, capacitor 116 is again coupled to voltage reference source 124 through resistor 122. This causes the voltage on capacitor 116 to increase to $V_{BG}$ at a rate that depends on the time constant of resistor 122 and capacitor 116. When switch 86 couples its A and B terminals together at time t3, the voltage on capacitor 88 is again coupled to the output of amplifier 84, closing the power control loop. The power control loop now causes the output voltage of amplifier 84 ($V_Y$) to increase back to its value at time t2 at a rate that depends on the time constant of capacitor 88. Thus, the voltage on capacitor 88 recovers the charge that it lost by leakage current associated with switch 86 during AM mode.

Ideally, the time constants of capacitors 88 and 116 are matched so that the voltages on capacitors 88 and 116 ramp up at the same rate. However, the time constant of capacitor 88 is dependent upon the bandwidth of transconductance amplifier 84 and external loop gains. Therefore, the time constant associated with resistor 122 and capacitor 116 is preferably longer than the time constant of capacitor 88 to account for variations in the loop bandwidth. This minimizes the chances that the voltage on capacitor 116 will overshoot the voltage on capacitor 88 after time t3. In selecting the time constant of capacitor 116 and resistor 122, consideration should also be given to the time it takes for the voltage on capacitor 116 to settle at a constant value. The time constant of resistor 122 and capacitor 116 should be short enough so that the voltage on capacitor 116 settles at a constant value before $V_{PCIN}$ starts to ramp down.

After time t3, the voltages on capacitor 88 and 120 ramp up or down (depending on the dominant leakage currents) to their voltage levels just before t2 so that the differential voltage at the inputs of amplifier 90 remains constant. A common mode input voltage change such as this is rejected by amplifier 90 so that $V_{OUT}$ recovers smoothly. If the time constants are not matched, then the differential voltage at the inputs of amplifier 90 changes after time t3 causing $V_{OUT}$ to change. A change in $V_{OUT}$ at time t3 causes undesirable distortion in $P_{OUT}$. Thus, capacitor 116 and resistor 122 form a low pass filter that tracks the voltage change on capacitor 88 after time t3.

$V_{PCIN}$ decreases to zero between times t3 and t4 as shown in FIG. 2. As a result, $V_{OUT}$ and $P_{OUT}$ also drop toward zero as $V_{PCIN}$ decreases. The voltage feedback signal at node 61 causes the voltage at the inverting input of amplifier 84 to decrease as $P_{OUT}$ decreases, providing a gradual decrease in $P_{OUT}$ as $V_{PCIN}$ ramps down to zero. Before time t4, $V_{PCIN}$ reaches zero as shown in FIG. 2, and amplifier 78 reduces the voltage at the inverting input of amplifier 84 to $V_{REF2}$. Shortly thereafter, $V_{OUT}$ and $P_{OUT}$ reach zero as well, and directional coupler 22 no longer provides a feedback signal to RF peak detector 70.

In an ideal circuit, the voltages at the inputs of power control amplifier 84 both equal $V_{REF2}$ after time t4, and $V_{OUT}$ is approximately zero volts (e.g., 200 μV). However, in practical RF power controllers, the differential voltage at the inputs of power control amplifier 84 may vary from zero by a significant amount due to power control amplifier 84 offset voltages (e.g., 10 mV). In addition, voltages at the inverting input of amplifier 84 may be higher or lower than $V_{REF2}$ due to offset voltages at $V_{PCIN}$ and RF peak detector 70 offsets. These offset voltages are canceled during the standby mode by the auto zero loop circuitry mentioned above.

Figure 4:
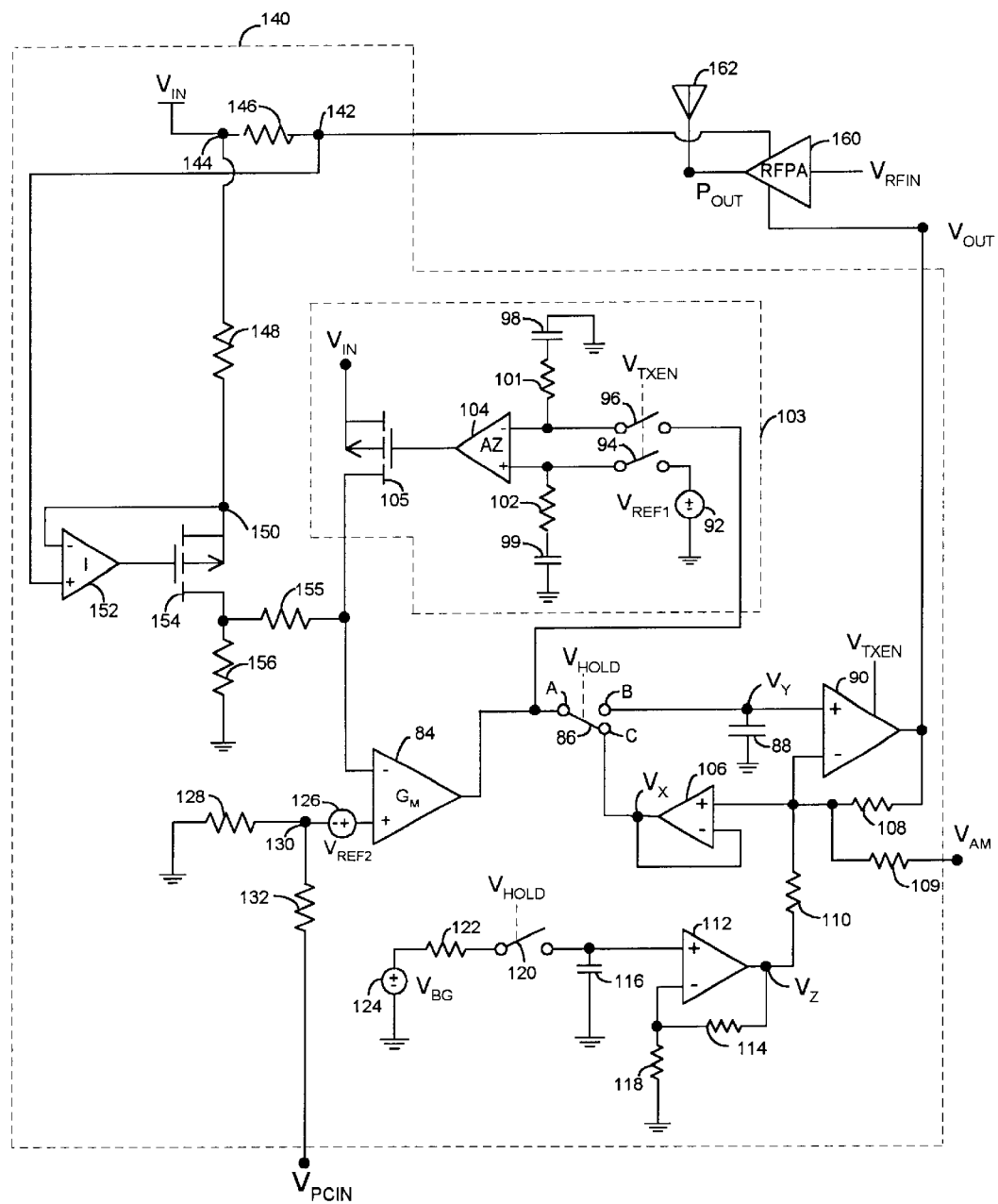
FIG. 4 is a schematic diagram of an RF power controller with a current feedback signal in accordance with the principles of the present invention.

A further embodiment of the present invention is shown in FIG. 4. RF power controller 140 in FIG. 4 uses a current feedback signal from current sense resistor 146 to regulate the power output signal of RF power amplifier 160. RF power controller 140 includes sense resistor 146, current sense amplifier 152, p-channel FET 154, resistor 148, resistor 155, and resistor 156. RF power controller 140 also includes resistors 128 and 132, voltage reference 126, power control amplifier 84, switch 86, buffer amplifier 106, capacitor 88, amplifier 90, resistors 108, 109, and 110, amplifier 112, resistors 114 and 118, capacitor 116, switch 120, resistor 122, voltage reference 124, auto zero loop circuitry 103, all of which function the same as discussed above with respect to FIG. 3. The waveforms in FIG. 2 also apply to the embodiment of FIG. 4.

Between times t1 and t2 in FIG. 2, $V_{PCIN}$ ramps up from zero, and $V_{HOLD}$ is LOW causing switch 86 to couple the output of amplifier 84 to the non-inverting input of amplifier 90. When $V_{OUT}$ ramps up from zero after time t1, RF power amplifier 160 turns ON to supply output power to antenna 162. RF power amplifier 160 draws supply current from input voltage source $V_{IN}$ at node 144 as it turns ON. $V_{IN}$ is a supply voltage. Current begins to flow from $V_{IN}$ through sense resistor 146 to RF power amplifier 160 creating a voltage drop across resistor 146. The voltage drop across resistor 146 appears between nodes 144 and 142. The supply current drawn by RF power amplifier 160 from $V_{IN}$ is proportional to the power output signal $P_{OUT}$ of RF power amplifier 160. Thus, if the power output signal of RF power amplifier 160 decreases, the current that RF power amplifier 160 draws from $V_{IN}$ also decreases. If $P_{OUT}$ increases, the current that RF power amplifier 160 draws from $V_{IN}$ also increases. RF power controller 140 measures the current that RF power amplifier 160 is drawing from $V_{IN}$ to indirectly measure $P_{OUT}$.

Current sense amplifier 152 measures the current through sense resistor 146 to generate a voltage signal indicative of the current through resistor 146. That voltage signal is applied to the inverting input of power control amplifier 84. Current sense amplifier 152 senses the current through resistor 146 as follows.

Current sense amplifier 152 amplifies the difference between the voltage at node 142 and the voltage at node 144. The voltage at node 150 is proportional to the voltage at node 142. The resistance value of resistor 148 should be significantly larger than resistor 146 so that most of the current drawn from $V_{IN}$ at node 144 flows through resistor 146 to RF power amplifier 160 (e.g., the ratio of resistors 148 to 146 may be 2000:1). The voltage at node 142 is near $V_{IN}$ when RF power amplifier 160 is drawing little or no current. As the current through sense resistor 146 increases, the voltage at node 142 drops. The drop in voltage at node 142 is amplified by current sense amplifier 152 and applied to the gate of p-channel FET 154 causing p-channel FET 154 to draw more current from $V_{IN}$ through resistors 148 and 156, as the voltage drop across resistor 146 increases. The increased current through resistor 156 causes the voltage at the inverting input of power control amplifier 84 to rise, which in turn causes the output voltage of amplifier 84 to rise more gradually as $V_{PCIN}$ increases. As the output of amplifier 84 rises gradually, amplifier 90 (which amplifies the output voltage of amplifier 84) causes $V_{OUT}$ and $P_{OUT}$ to rise gradually. $V_{OUT}$ and $P_{OUT}$ stop increasing after $V_{PCIN}$ stops increasing and the differential voltage at the inputs of amplifier 84 stabilizes.

After $V_{PCIN}$ stops increasing, the current feedback signal indicates to RF power controller 140 when $P_{OUT}$ is too low. Current sense amplifier 152 senses a decrease in the current through resistor 146. In response, current sense amplifier 152 causes the current through FET 154 to decrease, which causes the voltage across resistor 156 to decrease. Power control amplifier 84 senses a decrease in voltage at its inverting input and increases its output voltage, causing amplifier 90 to increase $V_{OUT}$. The increase in $V_{OUT}$ indicates to RF power amplifier 160 to increase $P_{OUT}$.

The current feedback signal also indicates to RF power controller 140 when $P_{OUT}$ is too high. Current sense amplifier 152 senses an increase in the current through resistor 146. In response, current sense amplifier 152 causes the current through p-channel FET 154 to increase, which causes the voltage across resistor 156 to increase. Power control amplifier 84 senses an increase in the voltage at its inverting input and decreases its output voltage, causing amplifier 90 to decrease $V_{OUT}$. The decrease in $V_{OUT}$ indicates to RF power amplifier 160 to decrease $P_{OUT}$. The current feedback signal from resistor 146 indicates to RF power controller 140 when RF power amplifier 160 needs to increase or decrease $P_{OUT}$ during enable mode. Thus, the current feedback signal across resistor 146 allows RF power controller 140 to regulate the output power signal of RF power amplifier 160.

$P_{OUT}$ becomes amplitude modulated between times t2 and t3 as with the previous embodiments. When $V_{HOLD}$ goes HIGH at time t2, switch 120 opens, and switch 86 couples its A and C terminals together, causing the output of amplifier 84 to be coupled to the output of buffer amplifier 106. The output of amplifier 84 does not effect the value of $V_{OUT}$ between t2 and t3. Amplifiers 90, 106, and 112 and capacitors 88 and 116 operate as discussed above with respect to FIG. 3. At time t3, $V_{HOLD}$ goes LOW again, switch 120 closes, and amplifier 84 is again coupled to the non-inverting input of amplifier 90. Amplifier 84 now controls $V_{OUT}$ of controller 140 using the current feedback signal, as discussed above, until $V_{TXEN}$ goes LOW disabling amplifier 90. When $V_{TXEN}$ goes LOW, standby mode begins, and switches 96 and 94 close. Auto zero amplifier 104 operates to cancel offset voltages in the power control loop during standby mode, as discussed above.

Figure 5:
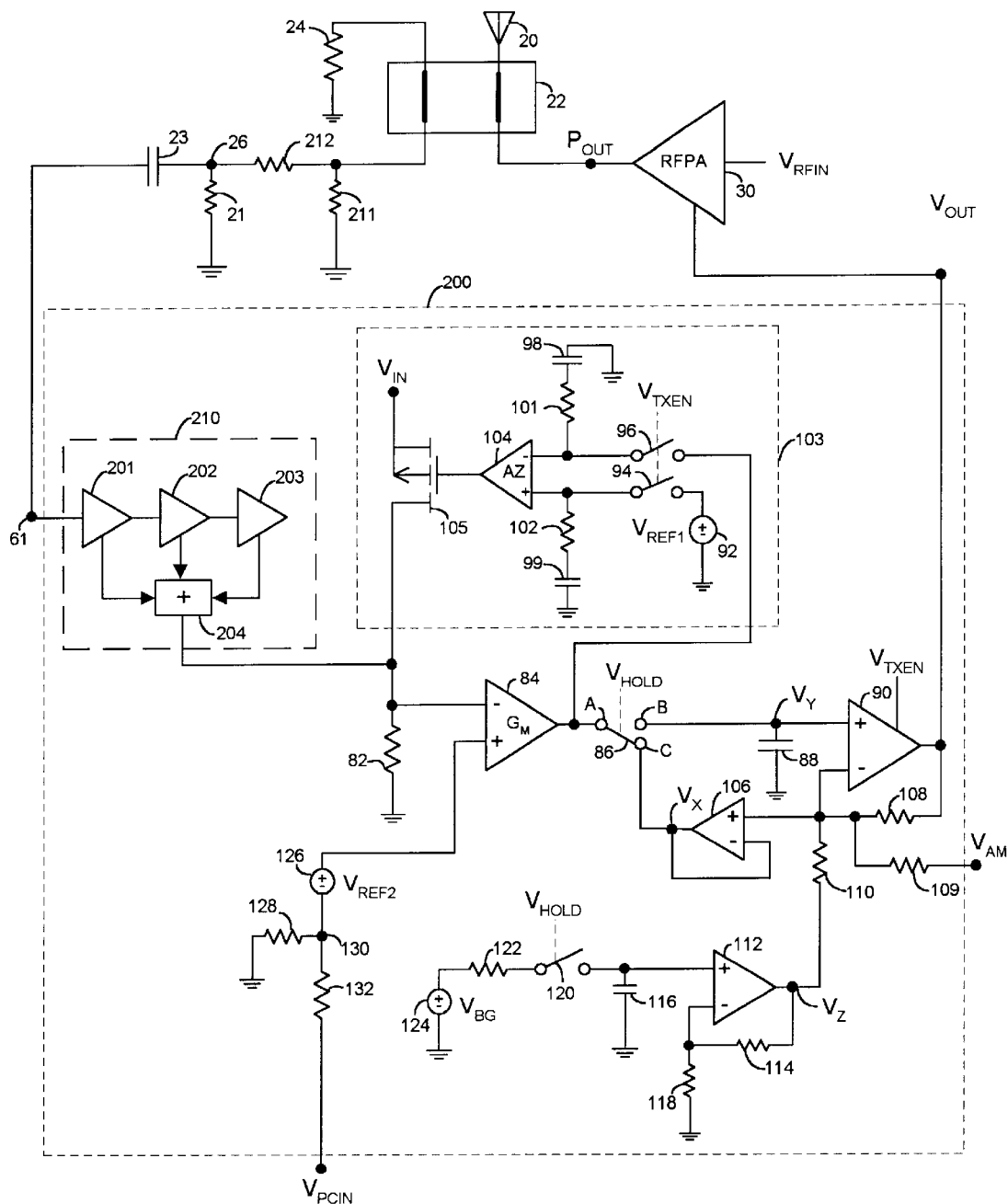
FIG. 5 is a schematic diagram of an RF power controller with a logarithmic detector in accordance with the principles of the present invention.

In a further embodiment of the present invention, the voltage feedback circuitry may comprise a logarithmic detector that is responsive to a voltage feedback signal drawn from $P_{OUT}$ as shown, for example, in FIG. 5. RF power controller 200 of FIG. 5 contains logarithmic detector 210 that provides a signal responsive to the voltage feedback signal to an input of power control amplifier 84. Resistors 211 and 212 have been added as shown in FIG. 5 to reduce the voltage feedback signal to a level that can be handled by logarithmic detector 210.

Logarithmic detector 210 includes amplification stages 201–203, and current summing stage 204. Each of amplification stages 201–203 are coupled together. Amplification stage 201 amplifies the voltage feedback signal at node 61; amplification stage 202 amplifies the output signal of amplification stage 201; and amplification stage 203 amplifies the output signal of amplification stage 202. Thus, each of amplification stages 201–203 amplifies the voltage feedback signal at node 61 by its respective gain factor. The voltage feedback signal becomes amplified by each amplification stage until amplification stage 203 is driven into limiting. When one of amplification stages 201–203 is driven into limiting, that amplification stage cannot increase its output signal any further. As the voltage feedback signal continues to increase, amplification stage 202 goes into limiting, and finally amplification stage 201 goes into limiting. The gain of each amplification stage 201–203 may be, for example, set to about 10 decibels (dB). In this case, logarithmic detector 210 with three amplification stages supplies up to 30 dB of gain to the voltage feedback signal. Additional amplification stages may be added to logarithmic detector 210 to increase its gain range.

Each amplification stage 201–203 in logarithmic detector 210 includes a detector, each of which outputs a current signal to current summing stage 204 that is proportional to the voltage output signal of that amplification stage. Each detector is set to operate over the gain range of its corresponding amplification stage. The current output signal of each detector is summed at current summing stage 204. The output of current summing stage 204 is a current that flows through resistor 82. Logarithmic detector 210 varies the current through resistor 82 proportionally with the voltage feedback signal. As the voltage feedback signal increases, the voltage drop across resistor 82 also increases causing $V_{OUT}$ to decrease. As the voltage feedback signal decreases, the voltage drop across resistor 82 also decreases causing $V_{OUT}$ to increase. Controller 200 includes the circuitry shown in FIGS. 3 and 4 that operates to maintain $V_{OUT}$ during AM mode, and the additional auto zero circuitry.

Persons skilled in the art further will recognize that the circuitry of the present invention may be implemented using circuit configurations other than those shown and discussed above. All such modifications are within the scope of the present invention, which is limited only by the claims which follow. For example, power controllers of the present invention are not limited to radio frequency power controllers, but may also include controllers that operate in other low frequency ranges such as audio frequencies.

What is claimed is:

1. A power controller for regulating a power output signal of a power amplifier using a control signal during an enable mode, the power controller comprising:
   feedback circuitry that receives a feedback signal from the power amplifier;
   a control amplifier that is responsive to a signal from the feedback circuitry; and
   a second amplifier that generates the control signal for regulating the power output signal during the enable mode, wherein:
   the second amplifier is responsive to an output signal of the control amplifier for regulating the power output signal during a first closed loop time period of the enable mode, and
   the second amplifier is not responsive to the output signal of the control amplifier for regulating the power output signal during a second open loop time period of the enable mode when the power output signal is amplitude modulated.

2. The controller of claim 1 wherein the feedback circuitry receives a voltage feedback signal from the power amplifier.

3. The controller of claim 2 wherein the feedback circuitry comprises a peak detector circuit that is responsive to the voltage feedback signal.

4. The controller of claim 3 wherein the feedback circuitry further comprises a detector amplifier coupled to the peak detector.

5. The controller of claim 2 wherein the feedback circuitry comprises a logarithmic detector that is responsive to the voltage feedback signal.

6. The controller of claim 1 wherein the feedback circuitry receives a current feedback signal from the power amplifier.

7. A power controller that regulates a power output signal of a power amplifier using a control signal, the power controller comprising:
   feedback circuitry that receives a feedback signal from the power amplifier;
   a control amplifier that is responsive to a signal from the feedback circuitry; and
   a second amplifier that generates the control signal, wherein:
   the second amplifier is responsive to an output signal of the control amplifier during a first period of time;
   the second amplifier is not responsive to the control amplifier output signal during a second amplitude modulation time period in the power output signal;
   the feedback circuitry receives a current feedback signal from the power amplifier; and
   the feedback circuitry comprises an amplifier that senses the current that flows to the power amplifier from an input voltage.

8. The controller of claim 7 wherein the feedback circuitry further comprises a sense resistor, and the amplifier in the feedback circuitry senses current through the sense resistor.

9. The controller of claim 1 wherein the control amplifier is also responsive to a power control input signal.

10. The controller of claim 1 wherein a first switch couples the control amplifier to the second amplifier during the first-time period, and decouples the control amplifier from the second amplifier during the second time period.

11. The controller of claim 1 wherein the second amplifier is a buffer amplifier.

12. The controller of claim 1 further comprising:
   a buffer amplifier that maintains the output signal of the control amplifier substantially constant during the second time period.

13. The controller of claim 1 wherein the control amplifier output signal is stored on a first capacitor during the second time period, and the second amplifier is responsive to the voltage on the first capacitor.

14. The controller of claim 13 wherein the second amplifier is also responsive to the voltage on a second capacitor.

15. A power controller that regulates a power output signal of a power amplifier using a control signal, the power controller comprising:
   feedback circuitry that receives a feedback signal from the power amplifier;

a control amplifier that is responsive to a signal from the feedback circuitry; and a second amplifier that generates the control signal, wherein the second amplifier is responsive to an output signal of the control amplifier during a first period of time, wherein the second amplifier is not responsive to the control amplifier output signal during a second amplitude modulation time period in the power output signal, wherein the control amplifier output signal is stored on a first capacitor during the second amplitude modulation time period, and the second amplifier is responsive to the voltage on the first capacitor, and wherein the second amplifier is also responsive to the voltage on a second capacitor; and a third amplifier that monitors the voltage on the second capacitor and provides a reference voltage to the second amplifier.

16. The controller of claim is further comprising:

a switch coupled to the second capacitor that is closed during the first time period and open during the second amplitude modulation time period.

17. The controller of claim 16 further comprising:

a reference voltage source coupled to the switch.

18. The controller of claim 1 wherein the control signal provided by the second amplifier is amplitude modulated during the second time period.

19. The controller of claim 1 wherein the power amplifier is a RF power amplifier and the power controller is an RF power controller.

20. A method for regulating a power output signal of a power amplifier using a control signal from a power controller during an enable mode, wherein the power controller is switched between the enable mode and a standby mode, the method comprising:

generating a first signal from a feedback signal that is indicative of the power output signal;

generating a second signal that is indicative of a power control input signal;

generating the control signal in response to the first and second signals during a first period of time in the enable mode; and generating the control signal in response to a voltage on a first capacitor that is not responsive to the first and second signals during a second period of time in the enable mode.

21. The method of claim 20 wherein generating the first signal further comprises generating the first signal in response to a voltage feedback signal indicative of the power output signal.

22. The method of claim 21 wherein generating the first signal further comprises generating the first signal using a peak detector circuit that is responsive to the voltage feedback signal.

23. The method of claim 21 wherein generating the first signal further comprises generating the first signal using a logarithmic detector that is responsive to the voltage feedback signal.

24. The method of claim 20 wherein generating the first signal further comprises generating the first signal in response to a current feedback signal indicative of the power output signal.

25. A method for regulating a power output signal of a power amplifier using a control signal from a power controller, the method comprising:

generating a first signal from a feedback signal that is indicative of the power output signal;

generating a second signal that is indicative of a power control input signal;

generating the control signal in response to the first and second signals during a first period of time; and generating the control signal in response to a voltage on a first capacitor that is not responsive to the first and second signals during an amplitude modulation time period in the power output signal, wherein generating the first signal further comprises:

generating the first signal in response to a current feedback signal indicative of the power output signal using an amplifier that senses the current flow to the power amplifier from an input voltage.

26. The method of claim 20 wherein generating the control signal in response to the first and second signals during the first period of time further comprises generating the control signal using a control amplifier coupled to the first and second signals.

27. The method of claim 26 further comprising:

coupling a buffer amplifier to the control amplifier during the second period of time to reduce voltage transients on the control signal at the end of the second period of time.

28. The method of claim 26 wherein generating the control signal during the first period of time and the second period of time further comprises generating the control signal in response to an output signal of a second amplifier.

29. The method of claim 28 wherein:

generating the control signal during the first period of time further comprises coupling the control amplifier to the second amplifier using a switch; and generating the control signal during the second period of time further comprises decoupling the control amplifier from the second amplifier using the switch.

30. The method of claim 28 wherein the second amplifier is a buffer amplifier.

31. A method for regulating a power output signal of a power amplifier using a control signal from a power controller, the method comprising:

generating a first signal from a feedback signal that is indicative of the power output signal;

generating a second signal that is indicative of a power control input signal;

generating the control signal in response to the first and second signals during a first period of time using a control amplifier coupled to the first and second signals;

generating the-control signal in response to a voltage on a first capacitor that is not responsive to the first and second signals during an amplitude modulation time period in the power output signal, wherein generating the control signal during the first time period and the amplitude modulation time period further comprises generating the control signal in response to an output signal of a second amplifier; the method further comprising:

providing a reference signal to the second amplifier using a third amplifier that monitors the voltage on a second capacitor to maintain the control signal substantially constant during the amplitude modulation time period.

32. The method of claim 31 further comprising:

opening a switch coupled to the second capacitor during the amplitude modulation time period.

33. The method of claim 31 further comprising:
providing a reference voltage to the second capacitor during the first period of time.

34. The method of claim 20 wherein the power amplifier is an RF power amplifier and the power controller is an RF power controller.

35. The method of claim 20 wherein the control signal is amplitude modulated during the second period of time.

36. A method for regulating a power output signal of a power amplifier using a control signal from a power controller during an enable mode, the method comprising:
generating a first signal from a feedback signal that is indicative of the power output signal;
generating the control signal in response to the first signal and a power control input signal during a first period of time of the enable mode; and
generating the control signal in response to the voltage on a first capacitor that is not responsive to the first signal during a second period of time of the enable mode when the power output signal is amplitude modulated,
wherein the control signal is also responsive to a reference voltage stored on a second capacitor that is not responsive to the first signal.

37. The method of claim 36 wherein generating the control signal during the first period of time further comprises:
generating the control signal in response to an output signal of a control amplifier that is coupled to receive the first signal and the power control input signal.

38. A method for regulating a power output signal of a power amplifier using a control signal from a power controller, the method comprising:
generating a first signal from a feedback signal that is indicative of the power output signal;
generating the control signal in response to the first signal and a power control input signal during a first period of time;
generating the control signal in response to the voltage on a first capacitor that is not responsive to the first signal during a second period of time when the power output signal is amplitude modulated; and
coupling a buffer amplifier to the control amplifier during the second period of time to reduce voltage transients on the control signal at the end of the second period of time, wherein the control signal is also responsive to a reference voltage stored on a second capacitor that is not responsive to the first signal, and wherein generating the control signal during the first period of time further comprises generating the control signal in response to an output signal of a control amplifier that is coupled to receive the first signal and the power control input signal.

39. The method of claim 37 wherein generating the control signal during the first and second periods of time further comprises:
generating the control signal in response to an output signal of a second amplifier.

40. A method for regulating a power output signal of a power amplifier using a control signal from a power controller, the method comprising:
generating a first signal from a feedback signal that is indicative of the power output signal;
generating the control signal in response to the first signal and a power control input signal during a first period of time;
generating the control signal in response to the voltage on a first capacitor that is not responsive to the first signal during a second period of time when the power output signal is amplitude modulated,
wherein the control signal is also responsive to a reference voltage stored on a second capacitor that is not responsive to the first signal,
wherein generating the control signal during the first period of time further comprises generating the control signal in response to an output signal of a control amplifier that is coupled to receive the first signal and the power control input signal,
wherein generating the control signal during the first and second periods of time further comprises generating the control signal in response to an output signal of a second amplifier, and
wherein a third amplifier monitors the reference voltage on the second capacitor and provides a signal to the second amplifier.

41. The method of claim 39 wherein generating the control signal during the second period of time further comprises:
decoupling the control amplifier from the second amplifier during the second period of time.

42. The method of claim 36 wherein generating the first signal further comprises generating the first signal in response to a voltage feedback signal indicative of the power output signal.

43. The method of claim 36 wherein generating the first signal further comprises generating the first signal in response to a current feedback signal indicative of the power output signal.

44. The method of claim 36 wherein the power amplifier is an RF power amplifier and the power controller is an RF power controller.

45. The controller of claim 1 wherein the controller is switched between the enable mode and a standby mode by an enable signal.

46. The controller of claim 45 wherein the second amplifier is disabled during a third period of time in the standby mode.

47. The controller of claim 46 further comprising:
auto zero loop circuitry, wherein the auto zero loop circuitry is coupled to the control amplifier during the third period of time in the standby mode to cancel offsets in the output of the control amplifier at the end of the third period of time.

48. The method of claim 20 wherein the control signal is phase modulated during the first period of time.

49. The method of claim 26 further comprising:
coupling auto zero loop circuitry to the control amplifier during a third period of time in the standby mode to cancel offsets in the output of the control amplifier at the end of the third period of time.

50. The method of claim 28 further comprising:
disabling the second amplifier during a third period of time in the standby mode.

51. The method of claim 50 further comprising:
coupling auto zero loop circuitry to the control amplifier during the third period of time in the standby mode to cancel offsets in the output of the control amplifier at the end of the third period of time.

52. The method of claim 29 wherein:
generating the control signal during the second period of time further comprises coupling a buffer amplifier to the control amplifier using the switch to reduce voltage transients on the control signal at the end of the second period of time.

53. The method of claim 36 further comprising:

switching the power controller between the enable mode and a standby mode, wherein the first and second periods of time occur during the enable mode.

54. The method of claim 39 further comprising:

switching the power controller between the enable mode and a standby mode, wherein the first and second periods of time occur during the enable mode; and disabling the second amplifier during a third period of time in the standby mode.

55. The method of claim 54 further comprising:

coupling auto zero loop circuitry to the control amplifier during the third period of time in the standby mode to cancel offsets in the output of the control amplifier at the end of the third period of time.

56. The method of claim 41 wherein generating the control signal during the second period of time further comprises:

coupling a buffer amplifier to the control amplifier to reduce voltage transients on the control signal at the end of the second period of time.

57. A power controller that regulates a power output signal of a power amplifier using a control signal, the power controller comprising:

feedback circuitry that receives a feedback signal from the power amplifier;

a control amplifier that is responsive to a signal from the feedback circuitry; and a second amplifier that generates the control signal, wherein:

the second amplifier is responsive to an output signal of the control amplifier during a first period of time, the second amplifier is not responsive to the control amplifier output signal during a second period of time, and a first switch couples a first buffer amplifier to the control amplifier during the second period of time to reduce voltage transients on the control signal at the end of the second period of time.

* * * * *

UNITED STATES PATENT AND TRADEMARK OFFICE
CERTIFICATE OF CORRECTION

PATENT NO.    : 6,628,165 B1
DATED         : September 30, 2003
INVENTOR(S)   : Henderson et al.

It is certified that error appears in the above-identified patent and that said Letters Patent is hereby corrected as shown below:

Column 2,
Line 19, change "the-ramping up" to -- the ramping up --;

Column 3,
Line 23, change "Of the RF" to -- of the RF --;

Column 4,
Line 22, change "effect" to -- affect --;

Column 7,
Line 5, change "So that" to -- so that --;
Line 16, change "fed from" to -- fed back from --;

Column 10,
Line 51, change "effect" to -- affect --;

Column 12,
Line 28, change "to coupled its" to -- to couple its --;

Column 14,
Line 56, change "effect" to -- affect --;

Column 16,
Line 49, change "the first-time period" to -- the first time period --; and Column 17,
Line 18, change "of claim is" to -- of claim 15 --.

Signed and Sealed this

Thirtieth Day of December, 2003

JAMES E. ROGAN
*Director of the United States Patent and Trademark Office*